United States Patent
Carlson

(10) Patent No.: US 7,030,993 B2
(45) Date of Patent: Apr. 18, 2006

(54) ATHERMAL ZERO-SHEAR INTERFEROMETER

(75) Inventor: Andrew Eric Carlson, Higganum, CT (US)

(73) Assignee: Zygo Corporation, Middlefield, CT (US)

( * ) Notice: Subject to any disclaimer, the term of this patent is extended or adjusted under 35 U.S.C. 154(b) by 302 days.

(21) Appl. No.: 10/422,615

(22) Filed: Apr. 24, 2003

(65) Prior Publication Data

US 2004/0004722 A1      Jan. 8, 2004

Related U.S. Application Data

(60) Provisional application No. 60/375,209, filed on Apr. 24, 2002.

(51) Int. Cl.
*G01B 11/02*      (2006.01)
(52) U.S. Cl. .................................................. 356/493
(58) Field of Classification Search ............... 356/487, 356/493, 498, 500
See application file for complete search history.

(56) References Cited

U.S. PATENT DOCUMENTS

| | | | |
|---|---|---|---|
| 4,784,490 A | 11/1988 | Wayne | |
| 4,802,765 A | 2/1989 | Young et al. | |
| 4,836,678 A * | 6/1989 | Okaji | ........................ 356/492 |
| 4,881,815 A | 11/1989 | Sommargren | |
| 4,881,816 A | 11/1989 | Zanoni | |
| 4,883,357 A | 11/1989 | Zanoni et al. | |
| 5,056,921 A * | 10/1991 | Chaney | ...................... 356/493 |
| 5,064,289 A | 11/1991 | Bockman | |
| 5,200,797 A | 4/1993 | Tank et al. | |
| 5,471,304 A | 11/1995 | Wang | |
| 5,483,343 A | 1/1996 | Iwamoto et al. | |
| 5,675,412 A | 10/1997 | Solomon | |
| 5,715,057 A | 2/1998 | Bechstein et al. | |
| 5,757,160 A | 5/1998 | Kreuzer | |

(Continued)

OTHER PUBLICATIONS

"Documentation Laser Interferometry in Length Measurement Techniques", Press of the Association of German Engineers, pp. 47-50 (Mar. 12 & 13, 1985), German document with English translation and with Affidavit of Accuracy.

(Continued)

*Primary Examiner*—Samuel A. Turner
(74) *Attorney, Agent, or Firm*—Fish & Richardson P.C.

(57) ABSTRACT

An interferometer for receiving a measurement beam from a target location on a stage of a semiconductor lithography machine and a reference beam from a reference location separated from the target location by a separation distance. The interferometer has a reference path to be traversed by the reference beam within the interferometer and a measurement path to be traversed by the measurement beam within the interferometer. Both the measurement path and the reference path are at least as long as the separation distance between the reference location and the target location.

25 Claims, 6 Drawing Sheets

U.S. PATENT DOCUMENTS

| | | |
|---|---|---|
| 5,757,491 A | 5/1998 | Cai et al. |
| 5,801,832 A * | 9/1998 | Van Den Brink ........... 356/500 |
| 6,020,964 A | 2/2000 | Loopstra et al. |
| 6,046,792 A | 4/2000 | Van Der Werf et al. |
| 6,208,424 B1 * | 3/2001 | de Groot ................... 356/500 |
| 6,252,667 B1 | 6/2001 | Hill et al. |
| 6,271,923 B1 | 8/2001 | Hill |
| 6,313,918 B1 | 11/2001 | Hill |
| 6,552,804 B1 | 4/2003 | Hill |
| 6,762,845 B1 | 7/2004 | Hill |
| 2002/0001087 A1 | 1/2002 | Hill |
| 2003/0053079 A1 | 3/2003 | Hill |
| 2004/0047027 A1 | 3/2004 | Carlson |

OTHER PUBLICATIONS

"Documentation Precision of Laser Interferometer Systems", Press of the Association of German Engineers, pp. 97-98 (Apr. 1989), German document with English translation and with Affidavit of Accuracy.

* cited by examiner

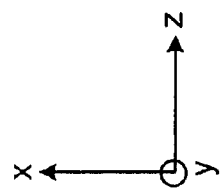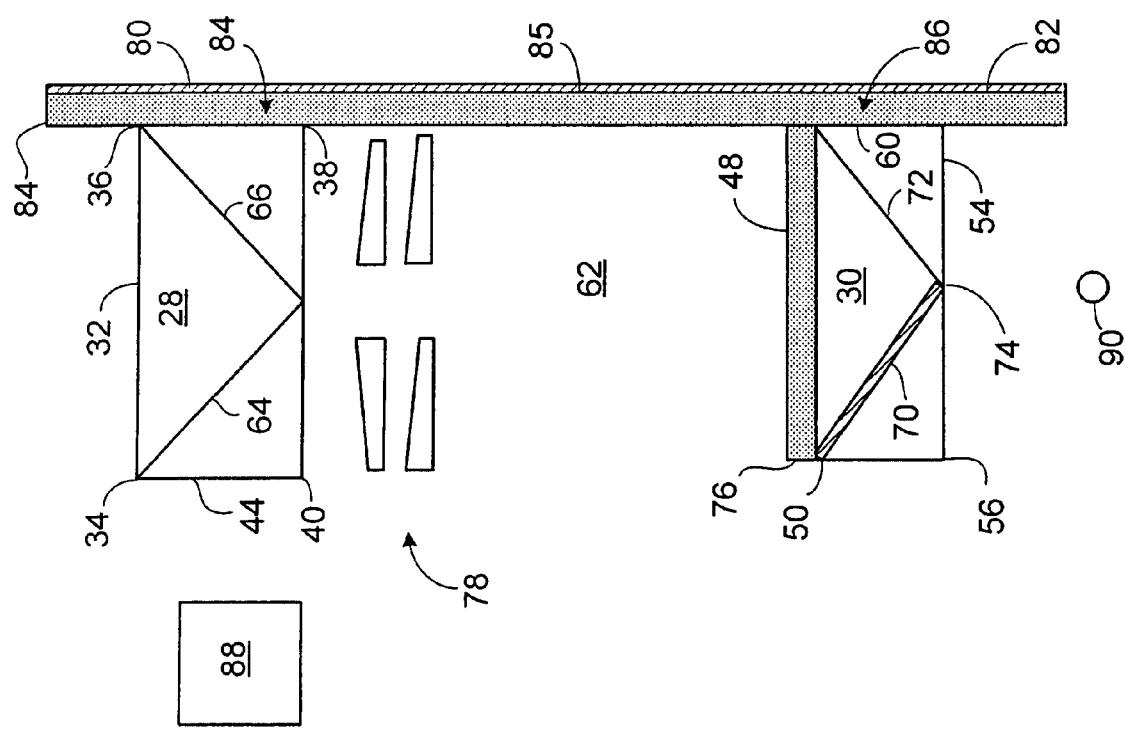
FIG. 6

ATHERMAL ZERO-SHEAR INTERFEROMETER

RELATED APPLICATIONS

This application claims the benefit of the Apr. 24, 2002 priority date of U.S. provisional application No. 60/375,209, the contents of which are herein incorporated by reference.

FIELD OF INVENTION

This invention relates to semiconductor lithography, and in particular, for interferometric measurement of position in a semiconductor lithography system.

BACKGROUND

A semiconductor lithography machine includes a moveable stage whose position must be known with great certainty. Such measurements are conventionally provided by a system of interferometers, each of which illuminates the stage with a measurement beam and a stationary target (for example, the projection optics column of the semiconductor lithography machine) with a reference beam. These interferometers combine the returning measurement beam and reference beam and observe the resulting interference between them. This interference is indicative of a difference in the path lengths traversed by the two beams, and hence the movement of the stage.

In many semiconductor lithography machines, the stationary target is located at some distance from the stage. As a result, the measurement beam and the reference beam are separated by a considerable distance. Conventional interferometers accommodate this distance by providing a monolithic structure that is long enough so that the reference beam and the measurement beam can exit the interferometer parallel to each other. Known monolithic structures for such interferometers are prone to introducing errors resulting from thermal expansion and beam shear.

SUMMARY

In one aspect, the invention includes an interferometer having first and second polarizing beam-splitters. The first polarizing beam-splitter directs an input beam in a direction that depends on a polarization state of the input beam. The second polarizing beam-splitter receives an output beam from the first polarizing beam-splitter and directs this received output beam in a direction that depends on its polarization state.

In one embodiment, a polarization rotator, which is on an optical path between the first and second polarizing beam-splitters, rotates the polarization of the output beam received from the first polarizing beam-splitter. An exemplary polarization rotator can be a half-wave plate.

In another embodiment, the interferometer also includes first and second retroreflectors. The first retroreflector is in optical communication with the first polarizing beam-splitter. The second retroreflector is in optical communication with the second polarizing beam-splitter.

In another embodiment, the interferometer also includes first and second reflective polarization-rotators in optical communication with the first and second retroreflectors respectively. Exemplary reflective polarization-rotators include a mirror coated with, or otherwise in optical communication with, a quarter-wave plate.

In another aspect, the invention includes an interferometer having a first polarizing beam-splitter in optical communication with a first retroreflector. A first reflective polarization-rotator lies on an optical path between the first polarizing beam-splitter and the first retroreflector. A second polarizing beam-splitter is in optical communication with a second retroreflector. A second reflective polarization-rotator lies on an optical path between the second polarizing beam-splitter and the second retroreflector. A third polarization rotator lies on an optical path between the first and second polarizing beam-splitters.

In one embodiment, the first polarizing beam-splitter includes first and second beam-splitting planes in optical communication with each other. The first beam splitting plane reflects light having a first polarization toward the third polarization rotator. The second beam-splitting plane transmits light having a second polarization received from the first beam-splitting plane to the first retroreflector and also reflects light received from the first retroreflector and having the first polarization toward the third polarization rotator.

In another embodiment, the second polarizing beam-splitter includes a mirror plane and a third beam splitting plane. The mirror plane redirects light received from the first polarizing beam-splitter. The third beam-splitting plane, which is in optical communication with the mirror plane, the second retroreflector, and the first polarizing beam-splitter, transmits light received from the mirror plane toward the second retroreflector, transmits light received from the second retroreflector and having the first polarization toward a detector, and transmits light received from the first polarizing beam-splitter and having the second polarization toward the detector.

Another embodiment of the interferometer includes a steering wedge on the optical path between the first polarizing beam-splitter and the second polarizing beam-splitter.

Another aspect of the invention includes an interferometer for receiving a measurement beam from a target location and a reference beam from a reference location separated from the target location by a separation distance. The interferometer has a reference path to be traversed by the reference beam within the interferometer and a measurement path to be traversed by the measurement beam within the interferometer. Both the measurement path and the reference path are at least as long as the separation distance between the reference location and the target location.

One embodiment of this interferometer includes first and second polarizing beam-splitters. Each of these polarizing beam-splitters is disposed to intersect both the reference path and the measurement path.

Another embodiment of the interferometer includes a polarization rotator disposed to intersect at least one of the reference path and the measurement path.

In yet another embodiment, the interferometer includes a polarization rotator disposed to intersect the reference path and the measurement path between the first and second polarizing beam-splitters. One example of such a polarization rotator is a half-wave plate.

In another aspect, the invention includes a semiconductor lithography system having at least one of the foregoing interferometers. The semiconductor lithography system includes a semiconductor lithography machine having a base and a stage moveable relative to the base. The base is in optical communication with the second polarizing beam-splitter of the interferometer. The stage is in optical communication with the first polarizing beam-splitter of the interferometer.

The invention also includes a method for determining the location of a moveable stage of a semiconductor lithography machine relative to a base separated from the stage by a separation distance. This method includes directing a measurement beam along a measurement path that intersects the stage and directing a reference beam along a reference path that intersects the base. The reference beam and measurement beam are both made to traverse a path length within an interferometer that is at least as long as the separation distance between stage and the base.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

These and other features and advantages of the invention will be apparent from the following detailed description and the accompanying figures, in which:

BRIEF DESCRIPTION OF THE FIGURES

FIGS. 5 and 6 show additional embodiments of the interferometer of FIG. 1.

DETAILED DESCRIPTION

Figure 1:
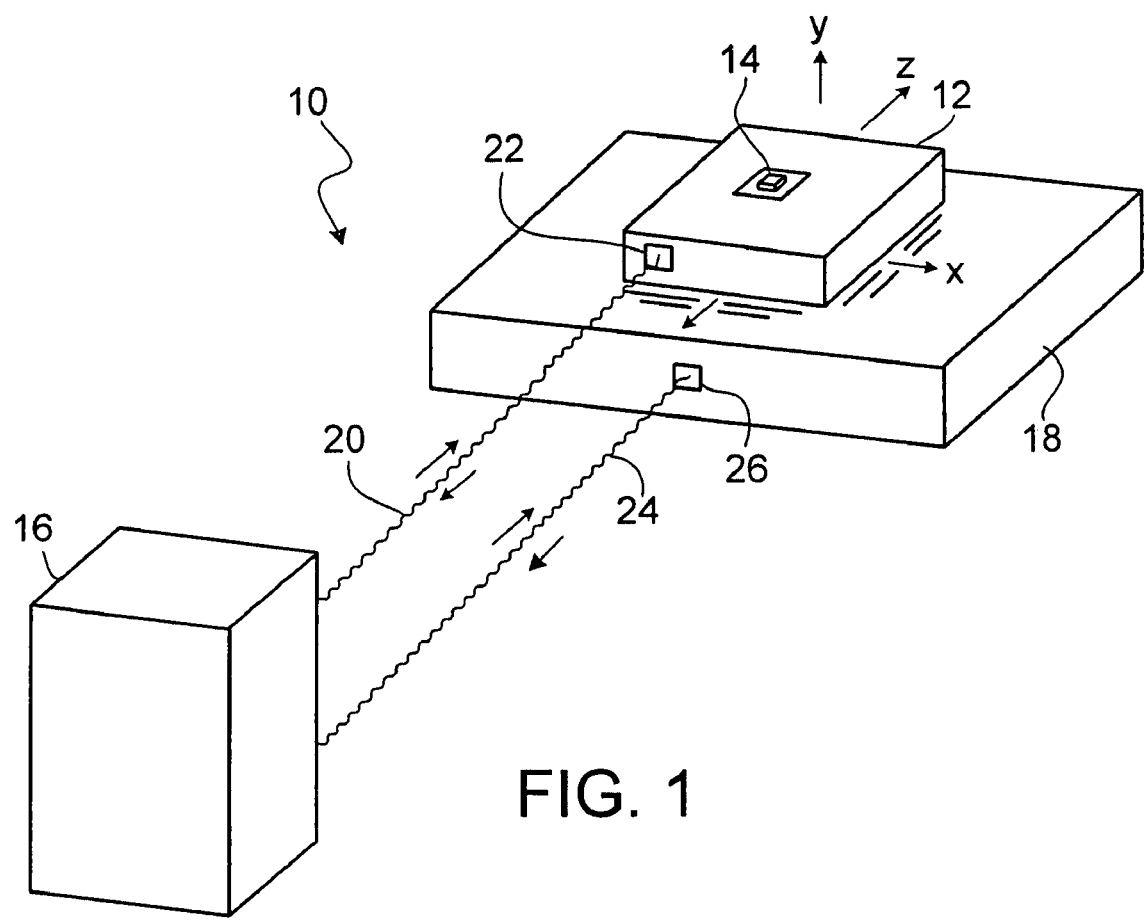
FIG. 1 shows a semiconductor lithography system incorporating an interferometer according to the invention.

Referring to FIG. 1, a semiconductor lithography machine 10 includes a moveable stage 12 for holding a work piece 14. In such a machine 10, it is desirable to know the position of the moveable stage 12 at any time. To measure this position, an interferometer 16 having a reference beam 24 and a measurement beam 20 is mounted so that its measurement beam 20 strikes a stage retroreflector 22 mounted on the moveable stage 12 and its reference beam 24 strikes a reference retroreflector 26 mounted on a base 18. The stage and reference retroreflectors 22, 26 reflect the measurement and reference beams 20, 24 back toward the interferometer 16. The interferometer 16 measures the interference between the returning measurement beam 20 and the returning reference beam 24. The extent of this interference provides a measure of the difference in path length traversed by the two beams 20, 24, and hence the position of the stage retroreflector 22 relative to the reference retroreflector 26.

The stage retroreflector 22 and the reference retroreflector 26 are made as close as possible to each other to reduce measurement error within the interferometer 16. However, because of mechanical constraints, the stage retroreflector 22 and the reference retroreflector 26 are often as much as 80 millimeters apart. An interferometer 16 according to the invention is intended to provide accurate measurements that do not depend in any significant way on the distance between the stage and reference retroreflectors 22, 26.

In certain embodiments, moveable stage 12 corresponds to a reticle stage and base 18 corresponds to a projection optics column for the semiconductor lithography machine.

Figure 2:
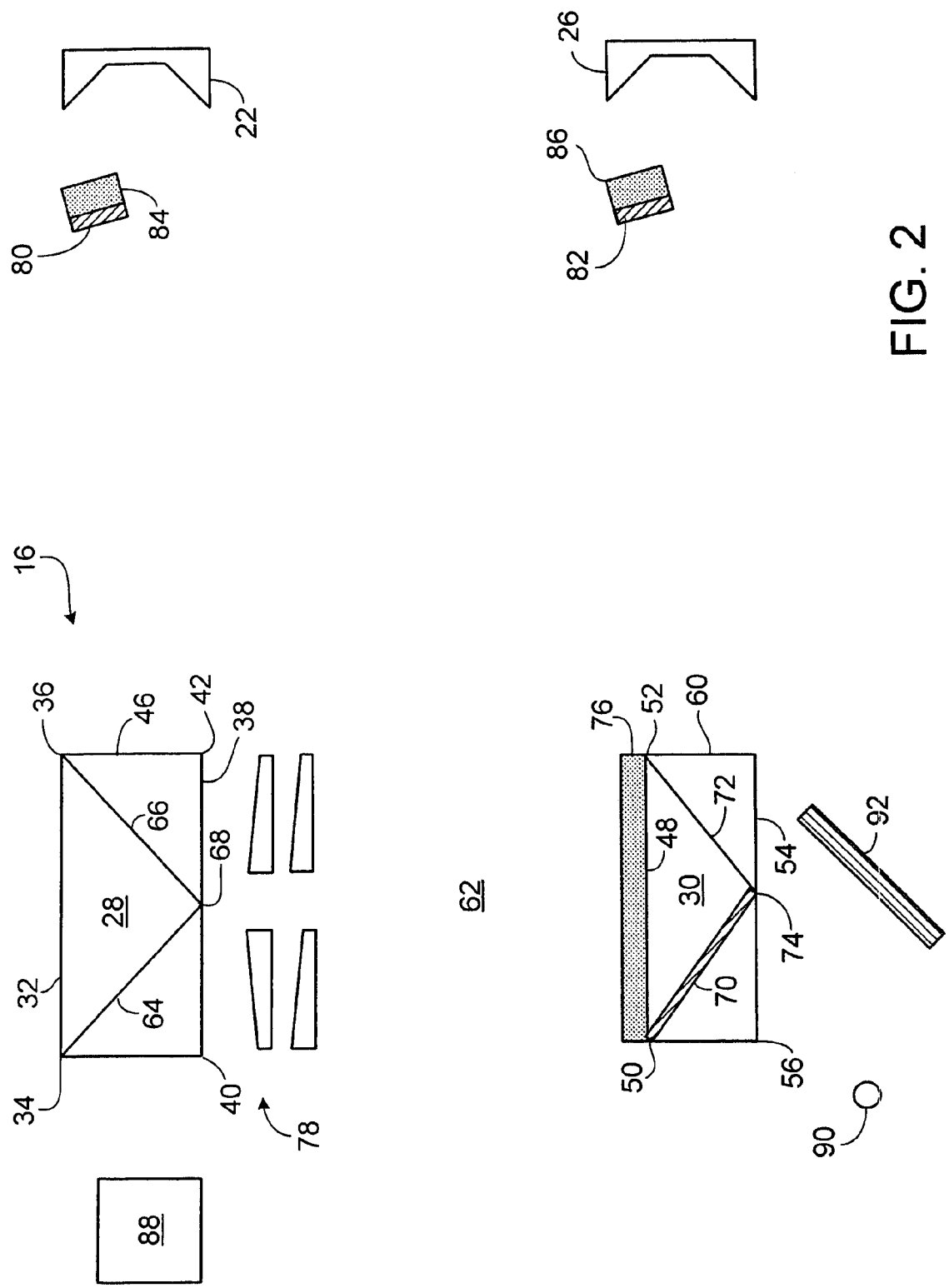
FIG. 2 shows one embodiment of the interferometer in FIG. 1.

Referring now to FIG. 2, the interferometer 16 has a measurement polarizing beam-splitter 28 and a reference polarizing beam-splitter 30. The measurement polarizing beam-splitter 28 has a planar top face 32 extending between first and second top edges 34, 36, a planar bottom face 38 extending between first and second bottom edges 40, 42, a planar input face 44 extending between the first top edge 34 and the first bottom edge 40, and a planar output face 46 extending between the second top edge 36 and the second bottom edge 42.

The reference polarizing beam-splitter 30 has a planar top face 48 extending between first and second top edges 50, 52, a planar bottom face 54 extending between first and second bottom edges 56, 58, and a planar output face 60 extending between the second top edge 52 and the second bottom edge 58. The bottom face 54 of the measurement polarizing beam-splitter 28 and the top face 48 of the reference polarizing beam-splitter 30 face each other across a gap 62.

The extent of the gap 62 separating the input and reference polarizing beam-splitter 30 depends on the distance between the stage and reference retroreflectors 22, 26. In one embodiment, the gap is an air gap or an evacuated gap that is not subject to temperature-induced expansion or local variations in index of refraction. However, even if the gap were filled with a solid optically transmissive medium having a non-zero coefficient of thermal expansion, any errors introduced by thermal expansion would be common to both a reference beam 24 and a measurement beam 20 passing through that medium. Hence, temperature expansion and contraction will introduce no appreciable relative error between the reference beam 24 and the measurement beam 20 regardless of the extent of the gap 62.

The measurement polarizing beam-splitter 28 has a first beam-splitting plane 64 that intersects its first top edge 34 and a second beam-splitting plane 66 that intersects its second top edge 36. The first and second beam-splitting planes 64, 66 intersect at a common line 68 extending along the bottom face 38 of the measurement polarizing beam-splitter 28.

The reference polarizing beam-splitter 30 has a mirror plane 70 that extends from its first top edge 50 and a beam-splitting plane 72 that extends from its second top edge 52. The mirror plane 70 and the beam-splitting plane 72 of the reference polarizing beam-splitter 30 intersect at a common line 74 extending along the bottom face of the reference polarizing beam-splitter 30.

Between the measurement polarizing beam-splitter 28 and the reference polarizing beam-splitter 30 is a half-wave plate 76 disposed to intercept a beam traveling from the bottom face 38 of the measurement polarizing beam-splitter 28 to the top face of the reference polarizing beam-splitter 30. Preferably, the half-wave plate 76 is on the top face 48 of the reference polarizing beam-splitter 30. As a result of this half-wave plate 76, any beam incident on the reference polarizing beam-splitter 30 will have its polarization rotated by ninety degrees before it enters the reference polarizing beam-splitter 30. Optional steering wedges 78 between the input and reference polarizing beam-splitter 30 ensure that beams traveling from the measurement polarizing beam-splitter 28 to the reference polarizing beam-splitter 30 are parallel to each other.

Between the output face 46 of the measurement polarizing beam-splitter 28 and the stage retroreflector 22 is a measurement mirror 80 disposed to intercept a beam reflected from the stage retroreflector 22 and to allow optical communication between the output face 46 of the measurement polarizing beam-splitter 28 and the stage retroreflector 22. Similarly, a reference mirror 82 is disposed to intercept a beam reflected from the reference retroreflector 26 and to allow optical communication between the output face 60 of the reference polarizing beam-splitter 30 and the stage retroreflector 22.

Figure 5:
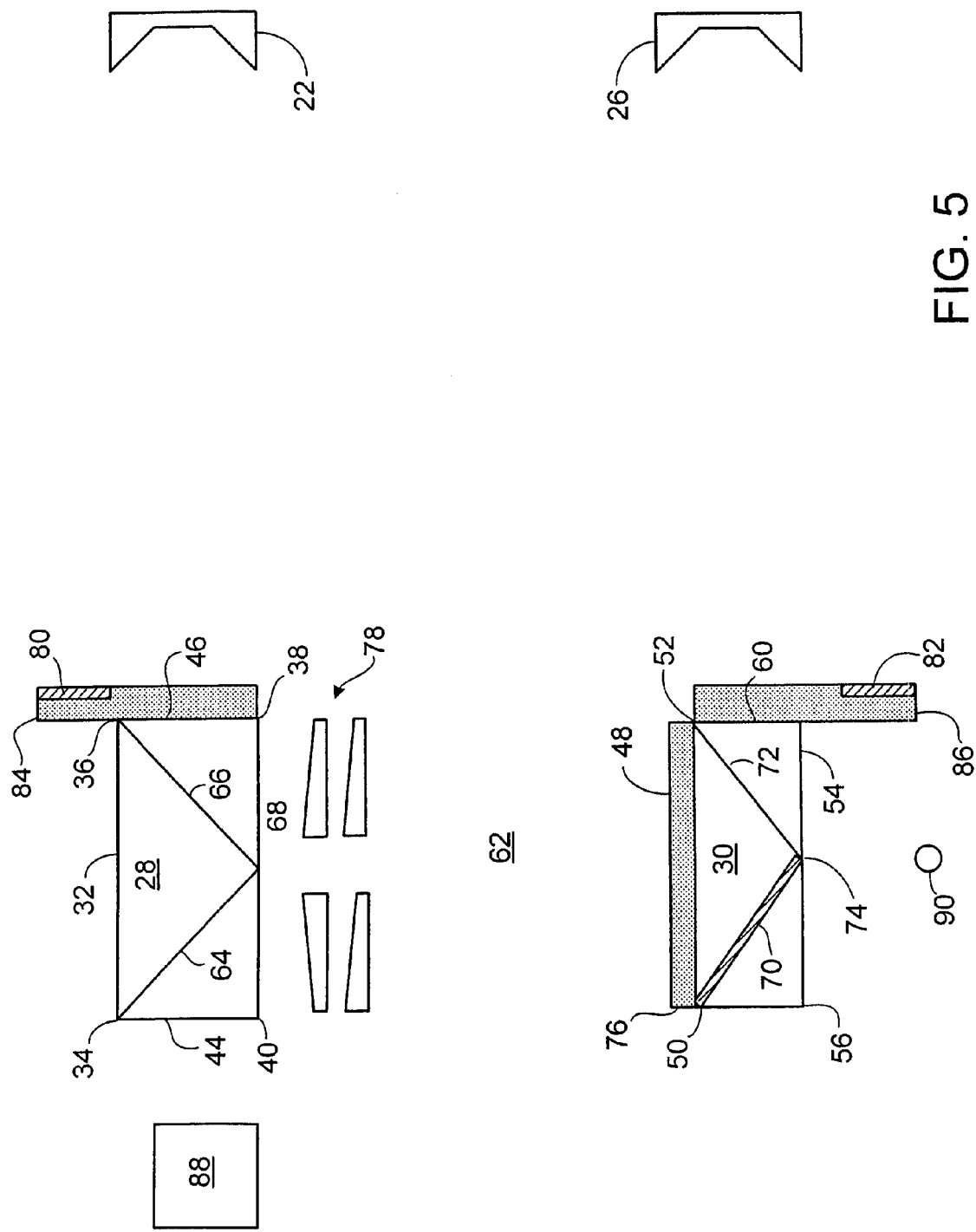

For clarity, the measurement mirror 80 and the reference mirror 82 are shown in FIG. 2 as being some distance from the measurement and reference polarizing beam-splitters 28, 30. However, the measurement mirror 80 and the reference mirror 82 can be anywhere on their respective optical paths. For example, in the embodiment shown in FIG. 5, both the reference mirror 82 and the measurement mirror 80 are secured to the reference and measurement polarizing beam-splitters 28, 30.

In another embodiment, shown in FIG. 6, a single bar mirror 85 has a measurement portion 80 and a reference portion 82. To avoid covering the output faces 46, 60 of the polarizing beam-splitters 28, 30, the bar mirror 85 is offset in a direction perpendicular to the plane of the drawing (i.e. in the y direction). The bar mirror 85 is attached to a single quarter-wave plate 87 having a reference portion 86 and a measurement portion 84 covering the respective output faces 60, 46 of the polarizing beam-splitters 30, 28.

In the configuration shown in FIG. 6, light exiting an output face 60, 46 experiences a 45 degree rotation in its polarization vector as it proceeds through the quarter-wave plate 87 toward a corresponding mirror portion 82, 80. Light returning from the mirror portion 82, 80 toward a corresponding output face 46, 60 experiences an additional 45 degree rotation in its polarization vector as it makes a second pass through the quarter-wave plate 87.

Each beam-splitting plane 64, 66, 72 has the property of transmitting a beam having a first polarization and reflecting a beam having a second polarization. It is common to refer to these polarizations as "P" and "S" polarizations respectively. However, throughout this document, the first polarization will be referred to as the "T" (for "Transmitted") polarization and the second polarization will be referred to as the "R" (for "Reflected") polarization.

The input face 44 of the measurement polarizing beam-splitter 28 is oriented to receive an input beam from a laser 88. The input beam is a combination of the reference beam 24 and the measurement beam 20. The reference beam 24 and the measurement beam 20 are coherent beams having different frequencies. In addition, the reference beam 24 and the measurement beam 20 have orthogonal linear polarizations.

Figure 3:
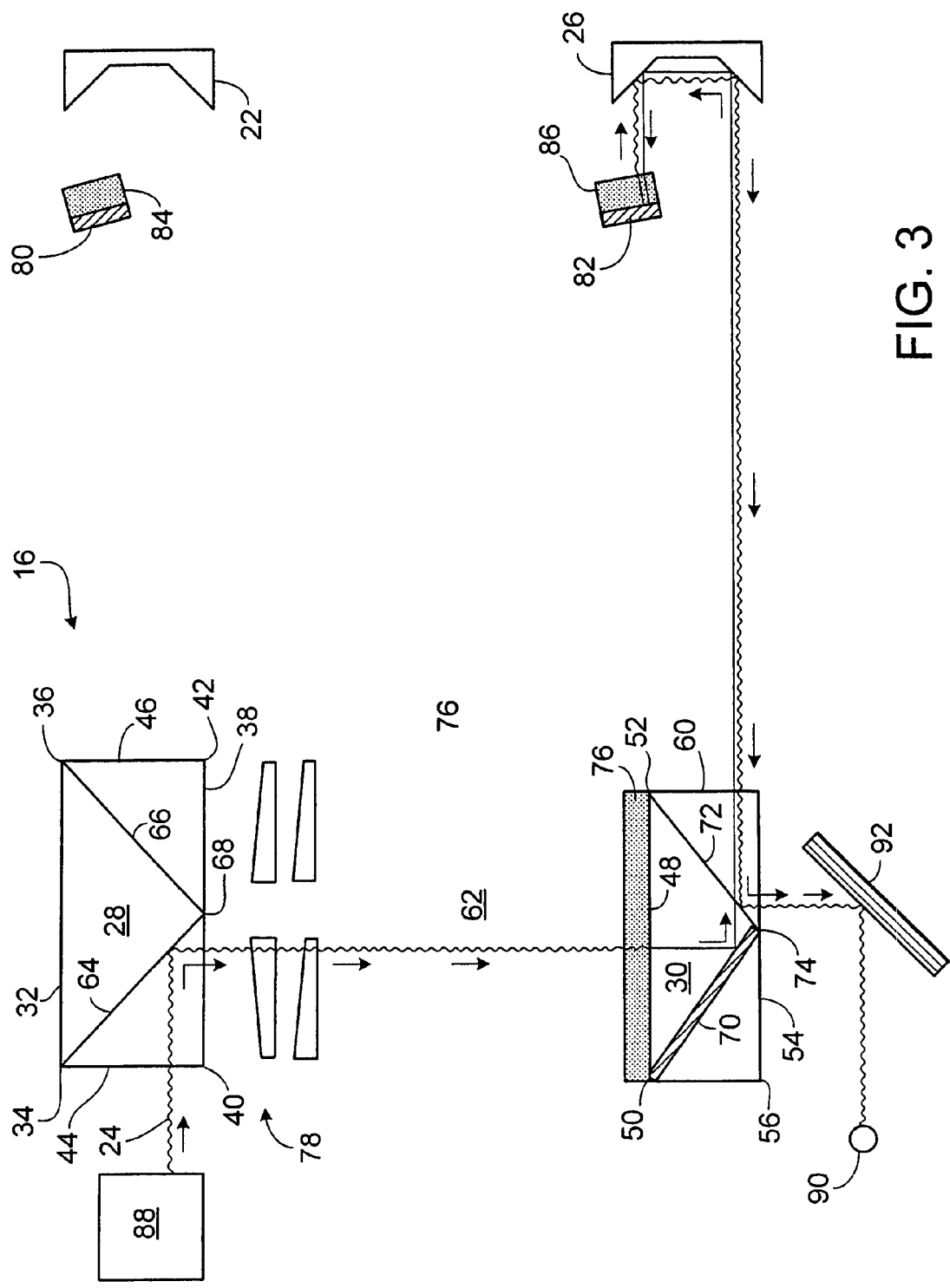
FIG. 3 shows the path of a reference beam through the system of FIG. 1.

Referring now to FIG. 3, an R-polarized reference beam 24 enters the input face 44 of the measurement polarizing beam-splitter 28. Being R-polarized, it cannot pass through the first beam-splitting plane 64. The first beam-splitting plane 64 reflects the reference beam 24 toward the top face of the reference polarizing beam-splitter 30.

Before entering the reference polarizing beam-splitter 30, the reference beam 24 passes through the half-wave plate 76. As a result, the reference beam 24 entering the reference polarizing beam-splitter 30 is T-polarized.

Within the reference polarizing beam-splitter 30, the reference beam 24 strikes the mirror plane 70, which reflects it toward the output face 60 of the reference polarizing beam-splitter 30. On its way to the output face 60, the reference beam 24 encounters the beam-splitting plane 72. Because the reference beam 24 is now T-polarized, it passes through the beam-splitting plane 72 and proceeds toward the reference retroreflector 26.

The reference retroreflector 26 directs the reference beam 24 to the reference mirror 82. The reference mirror 82 reflects the reference beam 24 back to the retroreflector. However, because the reference mirror 82 is coated with a quarter-wave plate 86, the reference beam 24 is now R-polarized once again.

The reference retroreflector 26 then directs the reference beam 24, which is now R-polarized, back to the output face 60 of the reference polarizing beam-splitter 30. Soon after re-entering the reference polarizing beam-splitter 30, the reference beam 24 encounters the beam-splitting plane 72 for the second time. This time, because the reference beam 24 is R-polarized, the beam-splitting plane 72 reflects it toward the bottom face 54 of the reference polarizing beam-splitter 30. The reference beam 24 exits the bottom face 54 and reaches a fiber optic pickup 90 by way of an optional fold mirror 92.

Figure 4:
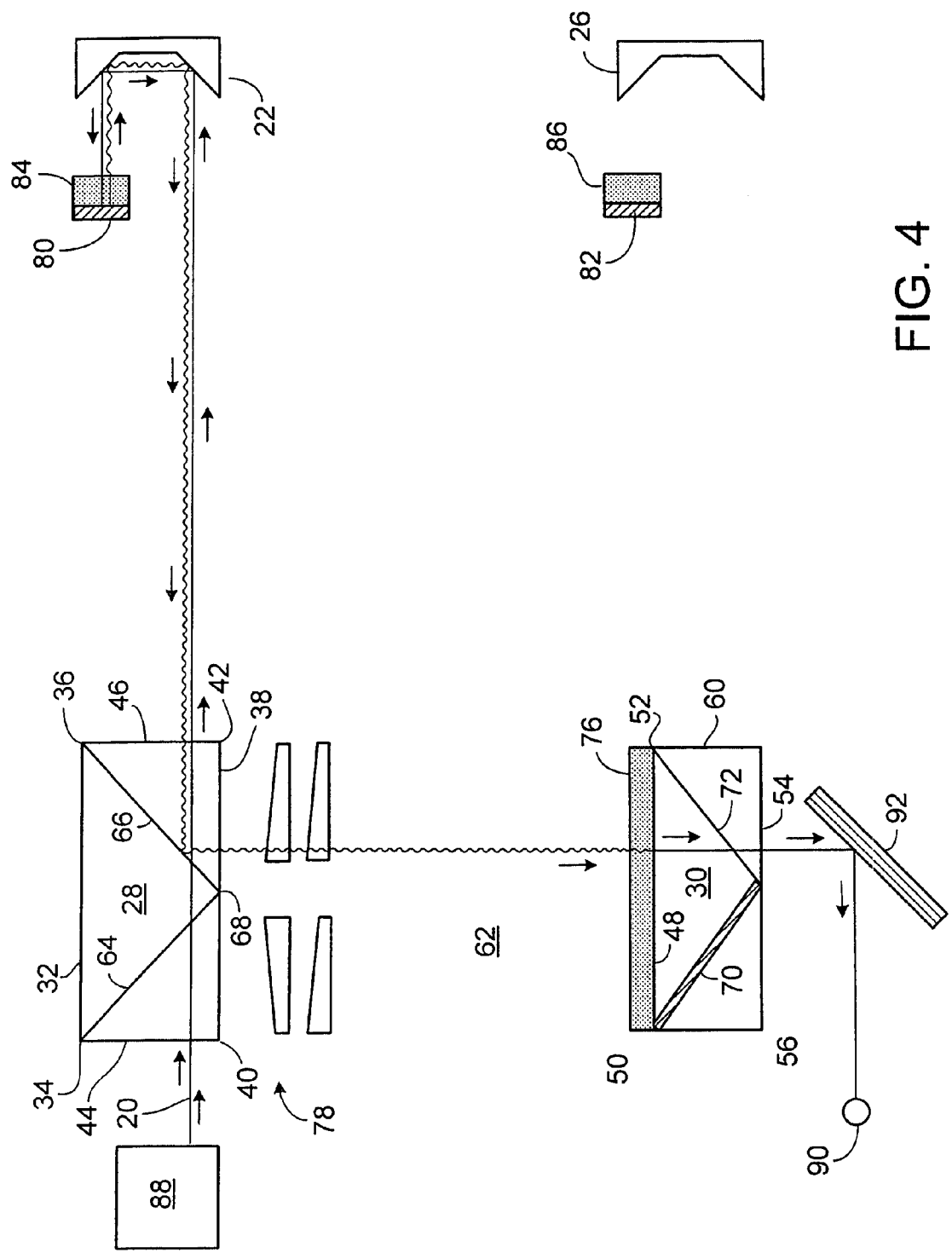
FIG. 4 shows the path of a measurement beam through the system of FIG. 1.

Meanwhile, as shown in FIG. 4, the T-polarized measurement beam 20 enters the input face 44 of the measurement polarizing beam-splitter 28 and encounters the first beam-splitting plane 64. Because the measurement beam 20 is T-polarized, it passes through both the first and second beam-splitting planes 64, 66, exits the output face 46 of the measurement polarizing beam-splitter 28, and proceeds to the stage retroreflector 22.

The stage retroreflector 22 directs the measurement beam 20 to the measurement mirror 80. The measurement mirror 80 reflects the measurement beam 20 back to the stage retroreflector 22. However, because the measurement mirror 80 is coated with a quarter-wave plate 84, the measurement beam 20 becomes R-polarized.

The stage retroreflector 22 then directs the measurement beam 20, which is now R-polarized, back to the output face 46 of the measurement polarizing beam-splitter 28. Soon after re-entering the measurement polarizing beam-splitter 28, the measurement beam 20 encounters the second beam-splitting plane 66 for the second time. This time, because the measurement beam 20 is R-polarized, the second beam-splitting plane 66 reflects it toward the bottom face 38 of the measurement polarizing beam-splitter 28. The measurement beam 20 exits the bottom face 38 of the measurement polarizing beam-splitter 28 and proceeds toward the top face 48 of the reference polarizing beam-splitter 30.

An advantage of the foregoing optical configuration lies in its freedom from shear error. It is apparent that if the stage retroreflector 22 were to translate in any direction, the path traveled by the measurement beam 20 as it returns from the stage retroreflector 22 would be unchanged. A displacement in the stage retroreflector 22 would cause the measurement beam 20 to be incident on a different portion of the retroreflector 22. However, the measurement beam 20 would continue to travel the same path relative to the polarizing beam-splitters 28, 30.

Before entering the reference polarizing beam-splitter 30, the measurement beam 20 passes through the half-wave plate 76. As a result, the measurement beam 20 entering the reference polarizing beam-splitter 30 is T-polarized.

Soon after entering the reference polarizing beam-splitter 30, the measurement beam 20 encounters the beam-splitting plane 72 of the reference polarizing beam-splitter 30. Because the measurement beam 20 is T-polarized, it passes through the beam-splitting plane 72 and proceeds toward the bottom face 54 of the reference polarizing beam-splitter 30.

The measurement beam 20 exits the bottom face 54 and reaches the fiber optic pickup 90 by way of the fold mirror 92.

In practice, some R-polarized light inevitably leaks through the beam-splitting planes 64, 66. This leakage potentially contributes to measurement errors. In an interferometer 16 according to the invention, however, a significant portion of this stray R-polarized light is reflected toward the top face 32, harmlessly away from the second polarizing beam-splitter 30.

For example, any R-polarized light from the reference beam 24 that passes through the first beam-splitting plane 64 soon encounters the second beam-splitting plane 66. This second beam-splitting plane 66 reflects this stray R-polarized light toward the top face 32 of the first polarizing beam-splitter 28, and hence away from the second polarizing beam-splitter 30. Any remaining R-polarized light returns from the measurement mirror 80 as T-polarized light. Upon re-entering the first polarizing beam-splitter 28, this T-polarized light proceeds through the second and first beam-splitting planes 66, 64 and exits the first polarizing beam-splitter 28 at the input face 44, in a direction away from the second polarizing beam-splitter 30.

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

I claim:

1. An interferometer comprising:
  a first polarizing beam splitter configured to direct an input beam in a direction that depends on a polarization state of the input beam;
  a first retroreflector in optical communication with the first polarizing beam splitter;
  a second polarizing beam splitter configured to receive an output beam from the first polarizing beam splitter and to direct the received output beam in a direction that depends on a polarization state thereof; and
  a second retroreflector in optical communication with the second polarizing beam splitter,
  wherein the first polarizing beam-splitter comprises:
    a first beam-splitting plane oriented to reflect light having a first polarization toward the second polarizing beam splitter, and
    a second beam-splitting plane in optical communication with the first beam-splitting plane, the second beam-splitting plane being oriented to transmit light having a second polarization received from the first beam-splitting plane to the first retroreflector and oriented to reflect light received from the first retroreflector and having the first polarization toward the second polarizing beam splitter.

2. The interferometer of claim 1, further comprising a polarization rotator on an optical path between the first and second polarizing beam splitters for rotating the polarization of the output beam received from the first polarizing beam splitter.

3. The interferometer of claim 2, wherein the polarization rotator comprises a half-wave plate.

4. The interferometer of claim 1, further comprising a steering wedge disposed on an optical path between the first and second polarizing beam splitters.

5. The interferometer of claim 1, further comprising:
  a first reflective polarization-rotator in optical communication with the first retroreflector;
  a second reflective polarization-rotator in optical communication with the second retroreflector.

6. The interferometer of claim 5, wherein at least one of the first and second reflective polarization-rotators comprises a mirror in optical communication with a quarter-wave plate.

7. A semiconductor lithography system comprising:
  an interferometer as recited in claim 1; and
  a semiconductor lithography machine having
    a base in optical communication with one of the polarizing beam splitters of the interferometer and supporting a corresponding one of the retroreflectors, and
    a stage moveable relative to the base, the stage being in optical communication with the other one of the polarizing beam splitters of the interferometer and supporting the other one of the retroreflectors.

8. The semiconductor lithography system of claim 7, wherein the base is a projection optics column and the stage is a reticle stage.

9. An interferometer comprising:
  a first polarizing beam splitter in optical communication with a first retroreflector;
  a first reflective polarization-rotator on an optical path extending from the first polarizing beam-splitter and including the first retroreflector;
  a second polarizing beam-splitter in optical communication with a second retroreflector;
  a second reflective polarization-rotator on an optical path extending from the second polarizing beam-splitter and including the second retroreflector; and
  a third polarization rotator on an optical path between the first and second polarizing beam-splitters,
  wherein the first polarizing beam-splitter comprises:
    a first beam-splitting plane oriented to reflect light having a first polarization toward the third polarization rotator, and
    a second beam-splitting plane in optical communication with the first beam-splitting plane, the second beam-splitting plane being
      oriented to transmit light having a second polarization received from the first beam-splitting plane to the first retroreflector, and
      oriented to reflect light received from the first retroreflector and having the first polarization toward the third polarization rotator.

10. The interferometer of claim 9, further comprising a steering wedge on the optical path between the first polarizing beam splitter and the second polarizing beam splitter.

11. The interferometer of claim 9, wherein the third polarization-rotator comprises a half-wave plate.

12. The interferometer of claim 9, wherein at least one of the first and second reflective polarization-rotators comprises a mirror in optical communication with a quarter-wave plate.

13. The interferometer of claim 9, wherein reflective portions of the first and second reflective polarization-rotators are defined by a common mirror.

14. An interferometer comprising:
  a first polarizing beam splitter in optical communication with a first retroreflector;
  a first reflective polarization-rotator on an optical path extending from the first polarizing beam-splitter and including the first retroreflector;

a second polarizing beam-splitter in optical communication with a second retroreflector;

a second reflective polarization-rotator on an optical path extending from the second polarizing beam-splitter and including the second retroreflector; and a third polarization rotator on an optical path between the first and second polarizing beam-splitters, wherein the second polarizing beam-splitter comprises a mirror plane oriented to redirect light received from the first polarizing beam-splitter; and a third beam-splitting plane in optical communication with the mirror plane,
with the second retroreflector, and
with the first polarizing beam-splitter, the third beam-splitting plane being
oriented to transmit light received from the mirror plane toward the second retroreflector,
oriented to transmit, toward a detector, light received from the second retroreflector and having the first polarization, and
oriented to transmit, toward the detector, light received from the first polarizing beam-splitter and having the second polarization.

15. A semiconductor lithography system comprising:
an interferometer comprising:
a first polarizing beam splitter in optical communication with a first retroreflector,
a first reflective polarization-rotator on an optical path extending from the first polarizing beam-splitter and including the first retroreflector,
a second polarizing beam-splitter in optical communication with a second retroreflector,
a second reflective polarization-rotator on an optical path extending from the second polarizing beam-splitter and including the second retroreflector, and
a third polarization rotator on an optical path between the first and second polarizing beam-splitters; and
a semiconductor lithography machine having
a base on which is mounted the second retroreflector;
a stage on which is mounted the first retroreflector, the stage being moveable relative to the base.

16. The semiconductor lithography system of claim 15, wherein the base is a projection optics column and the stage is a reticle stage.

17. A semiconductor lithography system comprising:
a base defining a reference location;
a stage defining a target location, the stage being moveable relative to the base;
a reference retroreflector mounted on the base at the reference location;
a measurement retroreflector mounted on the stage at the target location; and
an interferometer comprising:
a first polarizing beam splitter configured to direct an input beam in a direction that depends on a polarization state of the input beam, the first polarizing beam splitter in optical communication with one of the retroreflectors, and
a second polarizing beam splitter configured to receive an output beam from the first polarizing beam splitter and to direct the received output beam in a direction that depends on a polarization state thereof, the second polarizing beam splitter in optical communication with the other of the retroreflectors.

18. The semiconductor lithography system of claim 17, wherein the interferometer further comprises a steering wedge disposed on an optical path between the first and second polarizing beam splitters.

19. The semiconductor lithography system of claim 17, wherein the interferometer further comprises a first polarization-rotator on an optical path extending from the first polarizing beam-splitter and including the first one of the retroreflectors, a second polarization-rotator on an optical path extending from the second polarizing beam-splitter and including the second one of the retroreflectors, and a third polarization rotator on an optical path between the first and second polarizing beam-splitters.

20. The semiconductor lithography system of claim 19, wherein the first and second polarization-rotators each include a reflective surface defined by a common mirror.

21. The semiconductor lithography system of claim 17, wherein the base is a projection optics column and the stage is a reticle stage.

22. An interferometer comprising:
a first polarizing beam splitter configured to direct an input beam in a direction that depends on a polarization state of the input beam;
a first retroreflector in optical communication with the first polarizing beam splitter;
a second polarizing beam splitter configured to receive an output beam from the first polarizing beam splitter and to direct the received output beam in a direction that depends on a polarization state thereof;
a second retroreflector in optical communication with the second polarizing beam splitter; and
a common reflective surface in optical communication with each of the retroreflectors and positioned to redirect a beam received from each retroreflector back to that retroreflector and onto its corresponding polarizing beam splitter.

23. The interferometer of claim 22, further comprising a first polarization-rotator on an optical path between the common reflective surface and the first retroreflector, a second polarization-rotator on an optical path between the common reflective surface and the second retroreflector, and a third polarization rotator on an optical path between the first and second polarizing beam-splitters.

24. A semiconductor lithography system comprising:
the interferometer of claim 22;
a base supporting one of the retroreflectors; and
a stage movable relative to the base and supporting the other of the retroreflectors.

25. The semiconductor lithography system of claim 24, wherein the base is a projection optics column and the stage is a reticle stage.

* * * * *